United States Patent [19]
Kamata et al.

[11] Patent Number: 6,084,319
[45] Date of Patent: *Jul. 4, 2000

[54] LINEAR MOTOR, AND STAGE DEVICE AND EXPOSURE APPARATUS PROVIDED WITH THE SAME

[75] Inventors: Shigeto Kamata, Yokohama; Toshio Matsuki, Tokyo, both of Japan

[73] Assignee: Canon Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/951,107

[22] Filed: Oct. 15, 1997

[30] Foreign Application Priority Data

| Oct. 16, 1996 | [JP] | Japan | 8-294571 |
| Mar. 6, 1997 | [JP] | Japan | 9-051726 |
| Jul. 22, 1997 | [JP] | Japan | 9-195600 |

[51] Int. Cl.[7] .............. H02K 41/00; H02K 9/19
[52] U.S. Cl. .............. 310/12; 310/58; 310/60 A
[58] Field of Search .............. 310/12, 13, 14, 310/58, 59, 60 R, 61, 62, 63, 60 A

[56] References Cited

U.S. PATENT DOCUMENTS

| 3,974,406 | 8/1976 | Wehde | 310/67 R |
| 4,839,545 | 6/1989 | Chitayat | 310/12 |
| 5,021,698 | 6/1991 | Pullen et al. | 310/156 |
| 5,258,671 | 11/1993 | Vollenwyder et al. | 310/12 |
| 5,304,285 | 4/1994 | Meinecke et al. | 162/339 |
| 5,448,118 | 9/1995 | Nakamura et al. | 310/54 |
| 5,486,962 | 1/1996 | Boutaghou | 360/99.12 |
| 5,703,417 | 12/1997 | Kelly | 310/12 |
| 5,770,899 | 6/1998 | Hayashi | 310/12 |
| 5,898,245 | 4/1999 | Cochimin | 310/52 |

FOREIGN PATENT DOCUMENTS

| 2952-095 | 7/1980 | Germany . |
| 7-302124 | 11/1995 | Japan . |
| 7-302747 | 11/1995 | Japan . |
| 8-167554 | 6/1996 | Japan . |

*Primary Examiner*—Thomas M. Dougherty
*Assistant Examiner*—Judson H. Jones
*Attorney, Agent, or Firm*—Fitzpatrick, Cella, Harper & Scinto

[57] ABSTRACT

A linear motor including a coil and a jacket which covers the coil and allows a cooling medium to be supplied through a space in the jacket. The jacket is made of an insulating material, such as a ceramic material or a high-polymer resinous material. The linear motor can include a reinforcing member in the jacket for strengthening the jacket against the pressure of the cooling medium. Also disclosed are a stage device, an exposure apparatus, and a device producing method using such a linear motor.

41 Claims, 13 Drawing Sheets

LINEAR MOTOR, AND STAGE DEVICE AND EXPOSURE APPARATUS PROVIDED WITH THE SAME

BACKGROUND OF THE INVENTION

1. Field of the Invention

The present invention relates to a linear motor used in an X-Y stage of, for example, a semiconductor exposure apparatus or a form determining apparatus, or used in a precision positioning device of, for example, a high-precision processing machine. The present invention also relates to a stage device and an exposure apparatus using the linear motor.

2. Description of the Related Art

In semiconductor exposure apparatuses, form determining devices, and high-precision processing machines, there is a demand that anything to be processed, such as a wafer to be exposed, or anything to be measured be quickly and very precisely positioned. To respond to such a demand, progress is being made in the development of an X-Y stage or the like provided with a linear motor serving as a driving section which can allow precise positioning and has excellent responsiveness.

FIG. 22 is a view showing a generally-used reduction projection exposure apparatus comprising components such as a wafer stage (XY stage) E used for positioning a wafer W, a projection optical system A disposed thereabove, a reticle stage B, and a light source optical system C. Exposure light from the light source optical system C passes through a reticle on the reticle stage B in order to form an image thereof on the wafer W by means of the projection optical system A, whereby the reticle pattern is transferred onto the wafer W.

The wafer stage E is disposed above a table 110 in order to support the projection optical system A and the reticle stage B, with a body frame D rising from the table 110. Vibration removal devices H are provided between a base G, which supports the table 110, and a floor surface F.

The position of the wafer stage E is measured using a laser interferometer J, and the measured position is fed back to a control system of the wafer stage E. The light source optical system C is supported by a light source support K which rises directly from the floor surface F.

The wafer stage E is an X-Y stage comprising components such as a Y stage capable of reciprocating freely above the table 110 in a Y-axis direction, an X stage capable of reciprocating freely with respect to the Y stage in an X-axis direction, a Y drive section for moving the Y stage in the Y-axis direction, and an X drive section for moving the X stage in the X-axis direction.

The Y drive section and the X drive section for moving the Y stage and the X stage, respectively, are each provided with a linear motor of the type shown in FIGS. 20 and 21. The linear motor 140 comprises a movable element 141 integrally connected to the Y stage and the X stage, and a stator 142 extending through an opening in the movable element 141. The stator 142 comprises a coil row 142a and supports 142b for supporting the coil row 142a. The movable element 141 has a hollow frame comprising a pair of opposing iron plates (i.e, a yoke) 141b for holding a magnet 141a and a pair of aluminum plates 141c affixed to both ends of the iron plates 141b.

When current is supplied to each of the coils of the coil row 142a of the stator 142 of the linear motor 140, a thrust is produced due to the Lorentz force, causing the movable element 141 to move along the coil row 142a.

In the prior art, however, when, as mentioned above, current is supplied to the row of coils 142a, causing the linear motor 140 to be driven, the coils get heated. The heated coils heat structures therearound and the atmosphere, thereby reducing the positioning accuracy of the X-Y stage.

More specifically, part of the heat produced in the coils of the linear motor is transmitted to the support of the row of coils and reaches such structures as the body frame of the exposure apparatus, causing thermal deformation of these structures. The rest of the heat of the coils heats the atmosphere, causing the laser beam path of the laser interferometer to shake, as a result of which, errors occur in the measured values of the laser interferometer.

It has been experimentally found that a change of only 1° C. in the temperature of the atmosphere of the laser beam path of the laser interferometer produces an error of 100 nm in the measured value.

Specifically, in an X-Y stage of a semiconductor exposure apparatus which is required to have a positioning accuracy on the order of nanometers (nm), if the structures around the linear motor are, for example, 100 mm in length and have a coefficient of thermal expansion on the order of $1 \times 10^{-6}$, a 1° C. change in temperature causes a thermal deformation of 100 nm, so that such heating of the linear motor is a great obstacle in obtaining the required positioning accuracy.

The heating of the linear motor may also heat, for example, the wafer on the X-Y stage or the object to be measured, thus reducing the processing accuracy or the measuring accuracy.

An attempt has been made to overcome the problem of reduced positioning accuracy due to heating of the coils by the use of a cooling jacket or the like that forcefully cools the coils of the linear motor, as disclosed, for example, in Japanese Patent Laid-Open Nos. 7-302124, 7-302747, and 8-167554. However, when the cooling jacket is made of a non-insulating material, eddy currents are produced with the movement of the magnet and the yoke of the movable element of the linear motor, resulting in an increase in the so-called viscous resistance which opposes the driving force of the linear motor. Thus, the driving efficiency of the linear motor is reduced.

Further, when the flow rate of the cooling medium is increased to increase the cooling capability, the pressure of the cooling medium is increased. This increase in pressure outwardly deforms the thin portion of the jacket, which may cause it to contact the permanent magnet or cause it to break. To prevent such problems, it is necessary to sufficiently strengthen the thin portions of the jacket by the proper amount. On the other hand, it is necessary to decrease the distance between the permanent magnets in order to increase the magnetic flux density. Thus, there is a demand to make the thin portions thinner, to the extent possible, to make the jacket smaller.

SUMMARY OF THE INVENTION

Accordingly, it is an object of the present invention to provide a linear motor with a higher output than conventional motors. It is another object of the present invention to provide an excellent stage device, an exposure apparatus and device producing method using the linear motor of the present invention.

To this end, according to a preferred form of the present invention, there is provided a linear motor comprising a coil and a jacket which covers the coil and allows a cooling medium to be supplied through a space in the jacket. The jacket can be made of an insulating material, such as a ceramic material or a high-polymer resinous material. The linear motor can comprise a reinforcing member disposed in the jacket in order to strengthen the jacket against the pressure of the cooling medium.

In another aspect, the present invention provides a stage device, as well as an exposure apparatus, which utilize the linear motor of the present invention discussed above.

In yet another aspect, the present invention provides a device producing method for producing a device. The method includes holding a substrate by a stage device which comprises a linear motor, the linear motor comprising (i) a coil and (ii) a jacket, made of an insulating material, which covers the coil and allows a cooling medium to be supplied through a space in the jacket, and exposing the substrate held by the stage device, to produce a device.

In yet another aspect, the present invention provides a device producing method for producing a device. The method includes holding a substrate by a stage device which comprises a linear motor, the linear motor including (i) a coil, (ii) a jacket which covers the coil and allows a cooling medium to be supplied through a space in the jacket and (iii) a reinforcing member disposed in the jacket for reinforcing the jacket against the pressure of the cooling medium, and exposing a substrate held by the stage device, to produce a device.

Other objects and preferred embodiments of the present invention will become apparent from the following description.

DESCRIPTION OF THE PREFERRED EMBODIMENTS

A description will now be given of the preferred embodiments with reference to the drawings.

<Embodiment 1>

Figure 1:
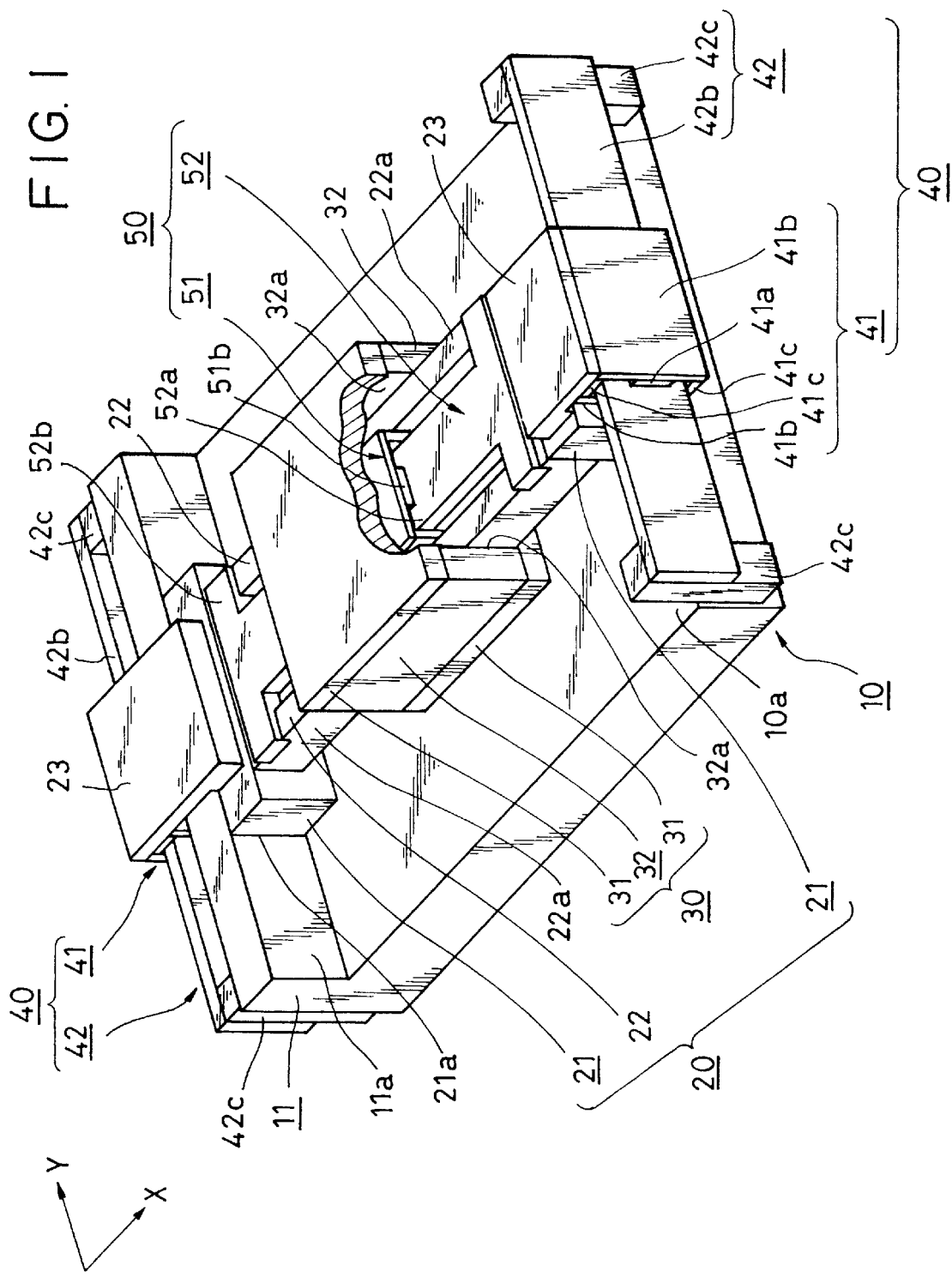
FIG. 1 is a perspective view of a wafer stage of an exposure apparatus in an embodiment of the present invention.
Figure 22:
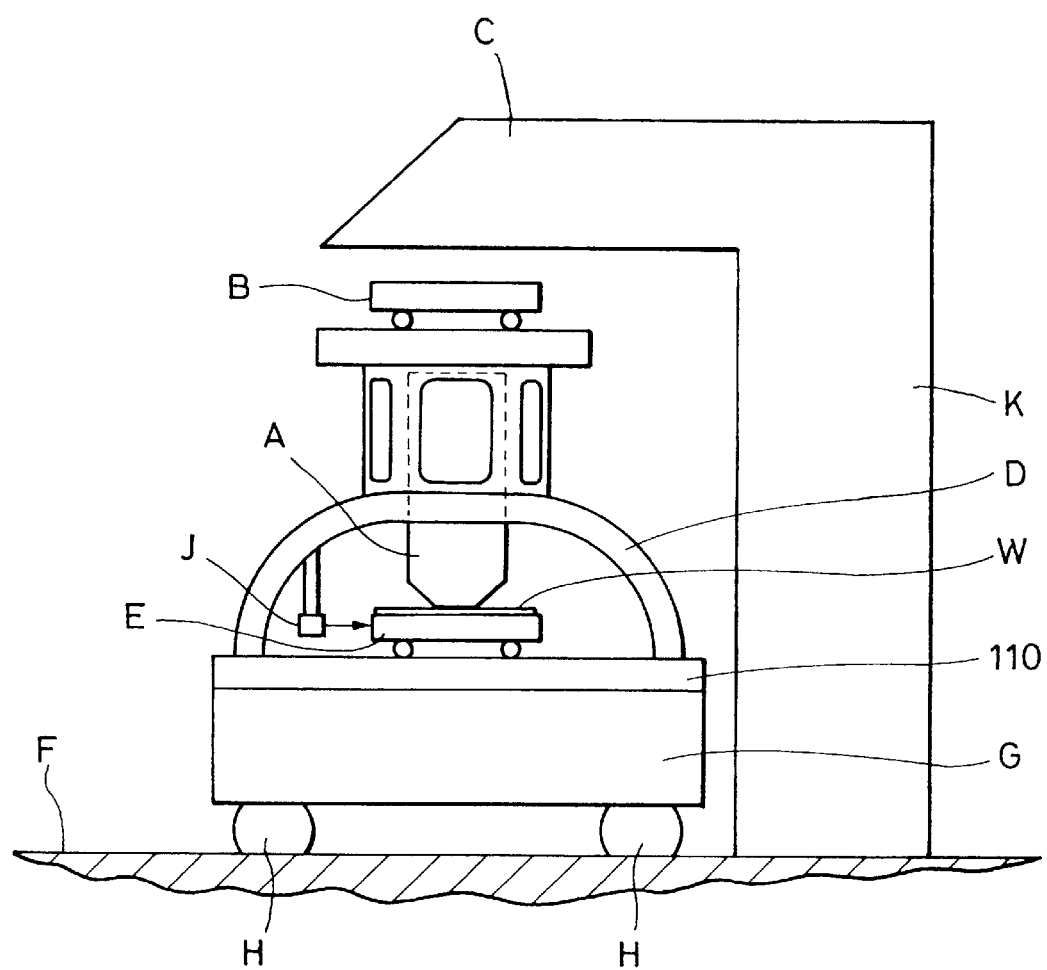
FIG. 22 is an elevational view of the entire exposure apparatus in the conventional example and in the present invention.

FIG. 1 is a view showing a wafer stage of an exposure apparatus in an embodiment of the present invention, with the structure of the exposure apparatus being essentially the same as that of the exposure apparatus of FIG. 22. Referring to FIG. 1, the stage device (X-Y stage) comprises a Y stage 20 which can reciprocate freely along a Y-axis direction above a table 10, an X stage 30 which can reciprocate freely along an X-axis direction with respect to the Y stage 20, a pair of Y linear motors 40 for moving the Y stage in the Y-axis direction, and an X linear motor 50 for moving the X stage 30 in the X-axis direction.

The table 10 has an XY guide surface 10a which supports the bottom surfaces of the Y stage 20 and the X stage 30, without contacting them, through, for example, an air pad (not shown). A Y guide 11 rises from one of the ends in the X-axis direction of the table 10 in order to guide the Y stage 20 in the Y-axis direction. A guide surface 11a of the Y guide 11 and the Y stage 20 are spaced apart from each other by means of, for example, an air pad (not shown). Driving the Y linear motor 40 causes the Y stage 20, disposed above XY guide surface 10a of the table 10, to move along the Y guide 11.

The Y stage 20 includes a long frame member comprising a pair of Y sliders 21 and a pair of X guides 22 disposed therebetween. The lower surfaces of both of the Y sliders 21 oppose the X-Y guide surface 10a of the table 10 and are supported by the surface 10a without contacting it through an air pad or the like (not shown). One of the Y sliders 21 is longer than the other in the Y-axis direction, with a side surface 21a of this longer slider 21 opposing the Y guide surface 11a of the Y guide 11 and being guided by the Y guide surface 11a without contacting it through an air pad or the like (not shown). Each Y slider 21 is connected to a movable element 41 of a corresponding Y linear motor through a corresponding connecting plate 23, with each connecting plate being connected to the movable element 41 of the corresponding Y linear motor 40 and the Y stage 20.

The X stage 30 includes a hollow frame member comprising a pair of top and bottom plates 31 and a pair of side plates 32 disposed therebetween, with both of the X guides 22 of the Y stage 20 and a stator 52 of the X linear motor 50 extending through the hollow portion of the X stage 20. The bottom surface of the bottom plate 31 opposes the X-Y guide surface 10a of the table 10, and is supported by the X-Y guide surface 10a without contacting it through an air pad or the like (not shown). On the other hand, the top surface of the top plate 31 is a wafer holding surface for holding, by attraction, a wafer, being a substrate.

The inner surfaces 32a of both side plates 32 of the X stage 30 face the X guide surfaces 22a, which are outer side surfaces, of each of the X guides 22 of the Y stage 20, and are guided without contacting the X guide surfaces 22a through an air pad or the like (not shown).

Figure 2:
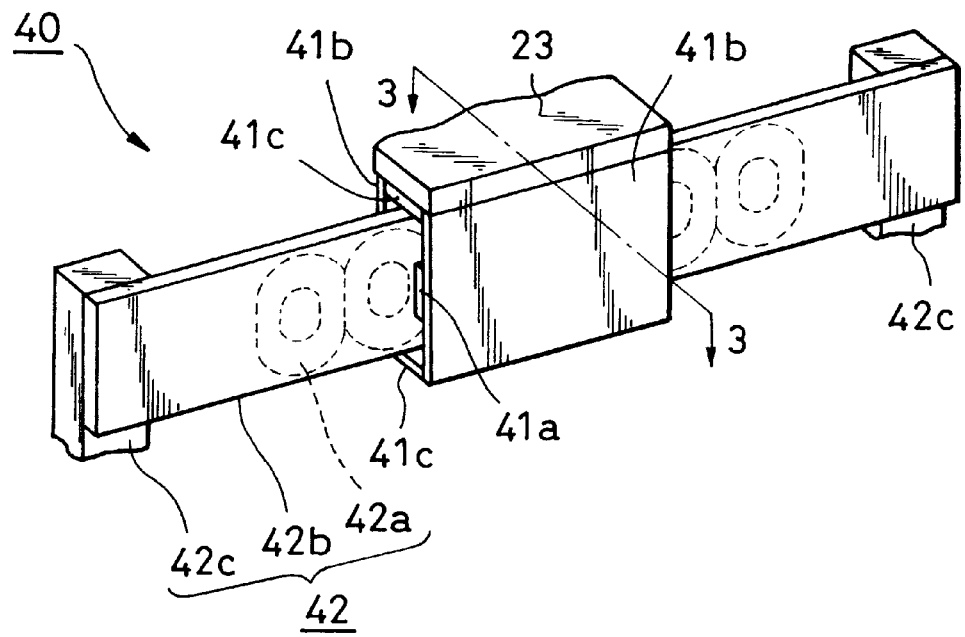
FIG. 2 is a perspective view of the linear motor of the apparatus shown in FIG. 1.
Figure 3:
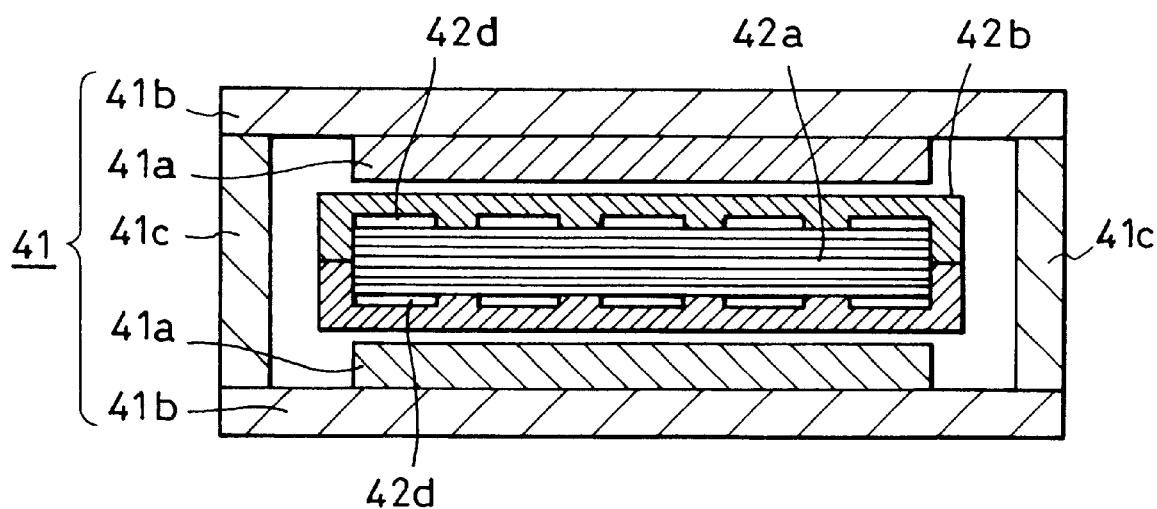
FIG. 3 is a cross-sectional view taken along line 3—3 of FIG. 2.

Each Y linear motor 40 comprises a movable element 41 integrally connected to its corresponding connecting plate 23, as mentioned above, and a stator 42 extending through an opening of its corresponding movable element 41. Each stator 42 comprises a coil row 42a disposed in the Y-axis direction as indicated by the broken lines of FIG. 2, a cooling jacket 42b which is a cooling means composed, for example, of a pair of cooling plates supporting the coil row 42a by sandwiching both sides of the row 42a (as shown in FIG. 3), and fixing members 42c supporting both ends thereof. Each movable element 41 includes a hollow frame member and magnetic means comprising a pair of opposing yokes 41b for holding magnets 41a and a pair of aluminum plates 41c affixed to both ends of the yokes 41b.

When current is supplied to the coils of the coil row 42a of the stators 42 of each of the Y linear motors 40, a thrust is produced due to the Lorentz force along the coil surfaces opposing the magnets 41a of each movable element 41, causing the Y stage 20 to move in the Y-axis direction.

The movable element 51 of the X linear motor 50 for moving the X stage 30 along the X guides 22 of the Y stage 20 includes a hollow frame member affixed to the lower surface of the top plate 31 of the X stage 30. Like each movable element 41 of the Y linear motors 40, the movable element 51 is a magnetic means comprising a pair of opposing yokes for holding a magnet 51a and a pair of aluminum plates affixed to both ends of the yokes.

Like each of the stators 42 of the Y linear motors 40, the stator 52 of the X linear motor 50 includes a row of coils (not shown) arranged in the X-axis direction and a cooling jacket 52b formed by a pair of cooling plates supporting both sides of the row of coils from both sides of the row. Supplying current to each of the coils of the row of coils produces a thrust in the movable element 51 due to the Lorentz force, causing the X stage 30 to move along the X guides 22 of the Y stage 20 in the X-axis direction.

The wafer on the X stage 30 is positioned in the X-Y direction by driving the Y linear motors 40, the X linear motor 50, and the like, as described above. After positioning of the wafer in the above-described way, light from the light source optical system, being an exposure means shown in FIG. 22, passes through a reticle placed in the light path and exposes the wafer.

Figure 4:
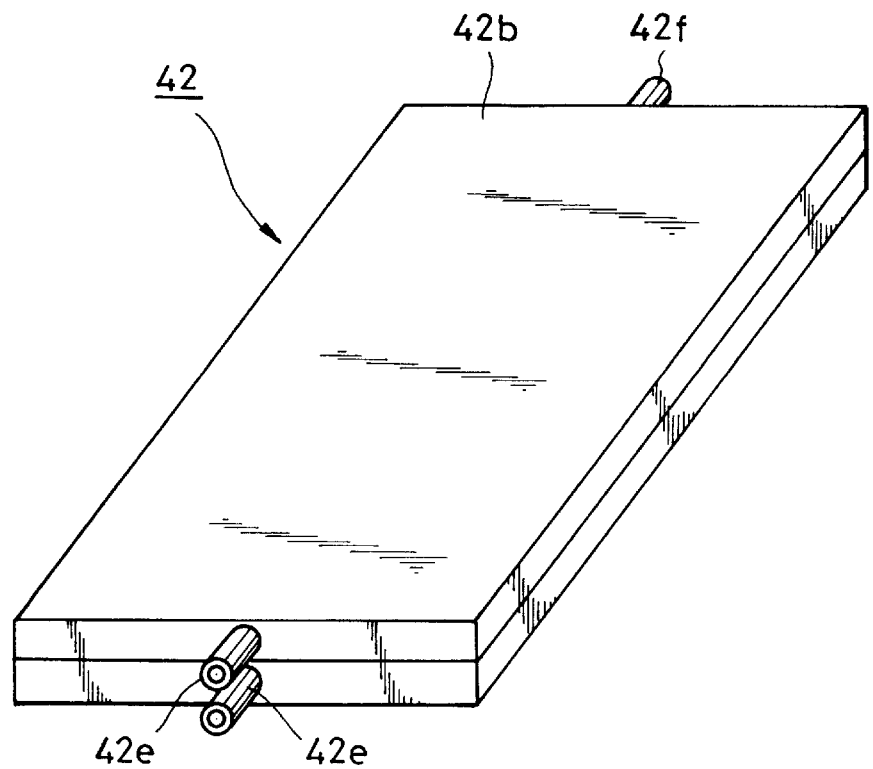
FIG. 4 is an external perspective view of the cooling jacket of the apparatus shown in FIGS. 2 and 3.

Each of the cooling jackets 42b of the Y linear motors 40 has a path 42d for permitting a cooling medium to flow toward the surfaces at both sides of the coils in the coil row 42a. Referring to FIG. 4, the cooling medium flows through the path 42d from a pair of supply tubes 42e disposed at one end of each cooling jacket 42b in the Y-axis direction to a drain tube 42f disposed at the other end of the cooling jacket in the Y-axis direction. The cooling jacket 52b of the X linear motor 50 also has a similar path for permitting a cooling medium to flow toward the surfaces at both sides of the coils in the row of coils as well as a similar supply tube and a drainage tube.

The cooling plates of the cooling jackets 42b of the Y linear motors 40 and the cooling plates of the cooling jacket 52b of the X linear motor 50 are made of an insulating material such as ceramic. Therefore, even if the movable elements 41 and the movable element 51 move along their corresponding cooling plates, the viscous resistances of the Y linear motor 40 and the X linear motor 50 will not increase as a result of the production of eddy currents or the like in the cooling jackets 42b and 52b.

Heat produced in the coil rows 42a and 52a of the Y linear motor 40 and the X linear motor 50, respectively, is absorbed by the cooling medium flowing through the cooling jackets 42b and 52b and carried to an external recovery device. This effectively prevents laser interferometers from producing errors in measured positions of the Y stage 20 or the X stage 30 caused when the Y linear motor 40 or the X linear motor 50 gets heated and heats the atmosphere. This also effectively prevents reduction in the wafer stage positioning accuracy caused when the Y linear motor 40 or the X linear motor 50 gets heated and heats structures around the motors, such as the table 10. Further, this can prevent a reduction in the positioning accuracy caused when the Y linear motor 40 or the X linear motor 50 gets heated and thermally distorts the wafer on the wafer stage.

Since, as mentioned above, the cooling jackets 42b and 52b of the Y linear motor 40 and the X linear motor 50, respectively, are composed of an insulating material, the driving efficiency of the Y linear motor 40 and the X linear motor 50 will not be reduced as a result of an increase in the viscous resistance due to eddy currents.

As a result, it is possible to greatly increase positioning accuracy of, for example, a wafer stage in an exposure apparatus, prevent losses in the driving power of a linear motor, increase transfer accuracy in an exposure apparatus, save labor, and reduce size.

When the cooling jackets of the Y linear motor and the X linear motor are made of a non-insulating material, the amount of eddy currents produced as a result of driving the Y linear motor and the X linear motor increases as the driving speed increases. This increase is a great obstacle to move the wafer stage or the like with a higher speed. The present embodiment helps to increase the speed of the wafer stage or the like, since eddy currents will not be formed in the cooling jackets.

<Embodiment 2>

Figure 5:
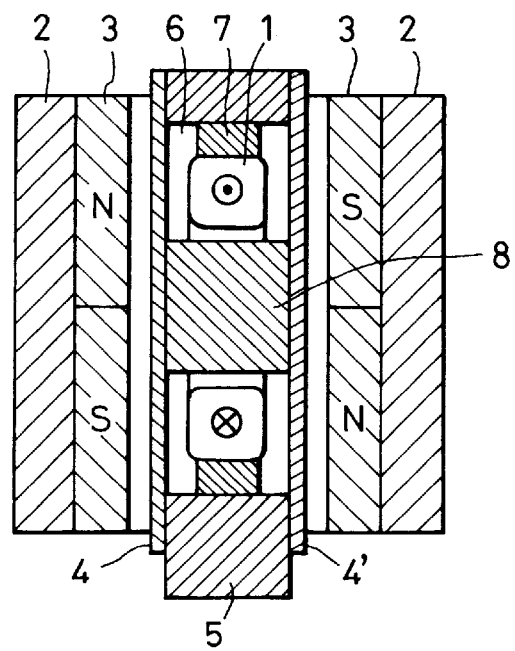
FIG. 5 is a top view of another embodiment of a linear motor.
Figure 6:
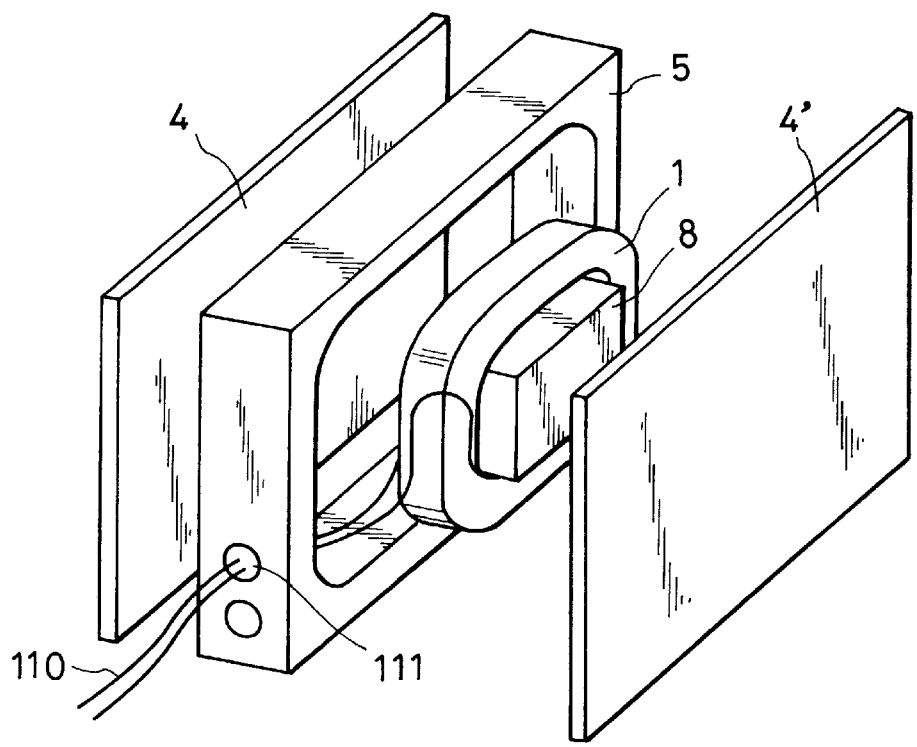
FIG. 6 is an exploded view of the structure of the jacket of the linear motor shown in FIG. 5.
Figure 7:
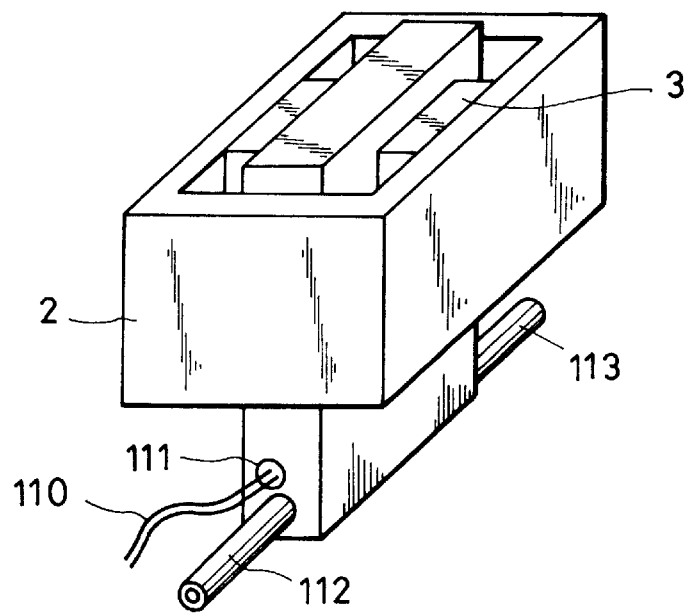
FIG. 7 is an external perspective view of a single-phase linear motor.

FIG. 5 is a view showing another embodiment of a linear motor in accordance with the present invention. FIG. 6 is an exploded view of the internal structure of this embodiment. FIG. 7 is a perspective view of a single-phase linear motor with a single coil.

Referring to FIG. 5, reference numeral 1 denotes a coil through which a driving current flows, reference numeral 2 denotes two yokes forming a magnetic circuit, and reference numeral 3 denotes opposing permanent magnets affixed to each of the yokes 2 and having different magnetic poles. Reference numerals 4 and 4' denote sheets with the coil 1 interposed therebetween, reference numeral 5 denotes a frame supporting the two sheets 4 and 4'. The sheets 4 and 4' and the frame 5 together make up the jacket surrounding the coil 1. The sheets 4 and 4' and the frame 5 are joined together using an adhesive, a bolt, or the like. Reference numeral 6 denotes an inside space in the jacket, and reference numeral 7 denotes a fixing means for fixing the coil 1 to the jacket. Reference numeral 8 denotes a reinforcing member which is a characteristic member of the present invention and functions as a pressure-resistant means for preventing an increase in the distance between the sheets 4 and 4' that have been affixed together with an adhesive, a bolt, or the like. The reinforcing member 8 is disposed in the air core portion of the wound coil 1. It is preferable that the sheets 4 and 4', the frame 5, and the reinforcing member 8 be made of nonmagnetic and insulating material, such as a high-polymer resinous material (e.g., PEEK) or a ceramic material.

Referring to FIGS. 6 and 7, reference numeral 110 denotes two lead wires of the coil 1, and reference numeral 111 denotes a small hole for leading the lead wires 110 from the inside to the outside of the jacket, respectively. The small hole 111 is air-tightly sealed with an adhesive or the like after the lead wires have been led out of the jacket in order to prevent the cooling medium from leaking out the small hole 111. Reference numerals 112 and 113 denote a cooling medium supply tube and recovery tube connected to the jacket. The cooling medium, supplied from the supply tube 112, flows through the jacket to absorb the heat produced in the coil, and is discharged from the recovery tube 113 for recovering it. The conductor coil 1, which has been subjected to surface treatment, does not directly contact the cooling medium. In this embodiment, the cooling medium is a liquid or a gas, and is, preferably, inert.

In the above-described construction, when current flows through the coil 1 disposed in the space between the permanent magnets 3 generating a fixed magnetic field, a Lorentz force is produced, which acts to move the coil 1 and the permanent magnets 3 vertically relative to each other. For example, when, in the top half portion of the figures, the magnetic field is generated from the left hand side to the right hand side, as viewed from the plane of the figures, and the current flows towards the observer from the back side, as viewed from the plane of the figures, a force is produced in accordance with the amount of current flow. This force acts upward on the coil 1 and downward on the permanent magnets, as viewed from the plane of the figures, so that they move relative to each other. Accordingly, the construction is one in which the affixed structures are driven using the yokes and the coil by supplying a predetermined amount of current to the coil. Although in the present embodiment, the linear motors are the so-called moving-magnet type motors in which the coil side is defined as the stator, while the yoke side holding the permanent magnets is defined as the movable element, the coil side may be defined as the movable element, while the yoke side may be defined as the stator.

By supplying a temperature-controlled cooling medium to the space 6 in the jacket, the heat produced when the coil is in electrical conduction is recovered to thereby prevent temperature rises of the coil itself or of the devices mounted to the linear motor or of the atmosphere therearound. In this case, the reinforcing member 8 prevents outward expansion of the sheets 4 and 4' due to the pressure of the cooling medium.

Although, in FIG. 5, the coil 1 is affixed to the frame 5 with the fixing means 7, it may be affixed to the sheets 4 and 4'. In addition, although in the foregoing description the reinforcing member 8 is not directly affixed to the coil 1, the coil 1 may be affixed to the reinforcing member 8 without using a fixing means 7. Further, the fixing means 7 and the reinforcing member 8 can be divided into a plurality of sections in use.

According to the present embodiment, deformation or breaking of the jacket can be prevented, even when the pressure of the cooling medium is raised or the jacket sheets are made thin, thus making it possible to increase the cooling efficiency by increasing the flow rate of the cooling medium. In addition, it is possible to reduce the size of the jacket, and increase the thrust of the linear motor.

<Embodiment 3>

Figure 8:
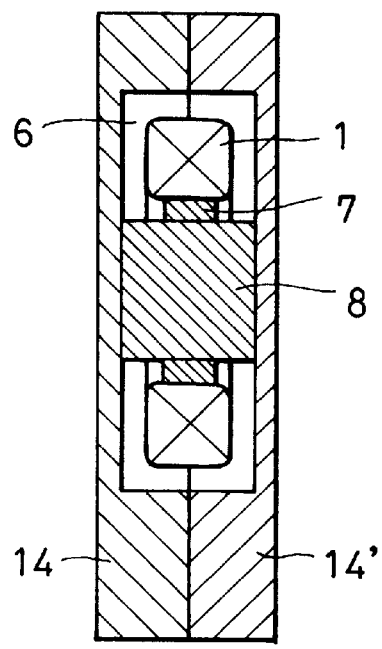
FIG. 8 is a view showing the jacket of another embodiment of a linear motor.

FIG. 8 is a view showing the structure of the jacket of a linear motor of another embodiment in accordance with the present invention. The arrangement of the yoke and permanent magnets of the movable element of the outer portion of the jacket is the same as the arrangement shown in FIG. 5.

In the previous embodiment, the frame and the sheets forming the jacket were separate component parts. In this embodiment, two jacket covers 14 and 14', each of which is formed by integrally forming a frame section and a sheet section, are used. These covers 14 and 14' are joined together. A reinforcing member 8 formed in the air core portion of the coil 1 in the jacket is affixed to the thin portions of each of the jacket covers 14 and 14' using adhesive, a bolt, or the like. The coil is fixed around the reinforcing member 8 through a fixing means 7.

In addition to the advantage of facilitating assembly due to the fewer number of parts required to produce the jacket, this structure provides the advantage of reducing the possibility of leakage of cooling medium from a joined portion, since only the jacket covers 14 and 14' need to be joined together.

<Embodiment 4>

Figure 9:
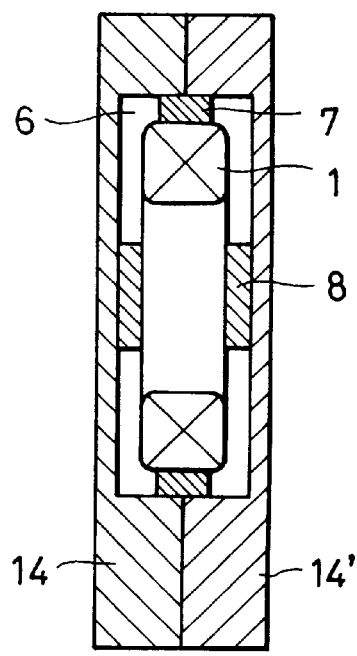
FIG. 9 is a view showing the jacket of still another embodiment of a linear motor.

FIG. 9 is a view showing the structure of the jacket of a linear motor in another embodiment in accordance with the present invention. The arrangement of the yoke and the permanent magnets of the movable element of the outer portion of the jacket is the same as the arrangement shown in FIG. 5.

A feature of the present embodiment is that the two reinforcing members are affixed between the coil sides and the thin portions of the jacket covers 14 and 14', so that they do not extend through the air-core portion of the coil 1. The reinforcing members 8 may be integrally formed with the jacket covers 14 and 14' into a single member. Since the coil 1 and the jacket covers 14 and 14' are fixed together by means of the reinforcing members 8, a fixing means 7 is not necessary.

By virtue of such a structure, the reinforcing members can be positioned independent of the shape and position of the coil, since the reinforcing member does not extend through the air core portion of the coil.

<Embodiment 5>

Figure 10:
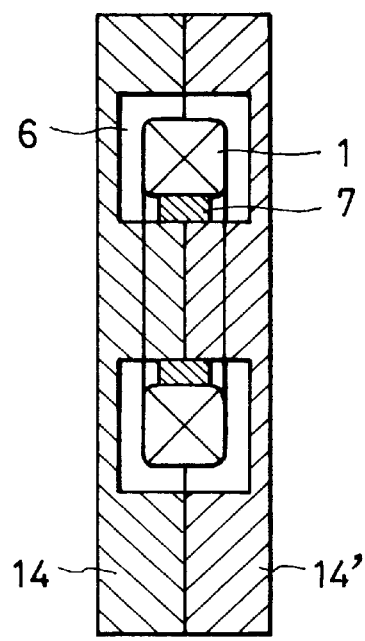
FIG. 10 is a view showing the jacket of still another embodiment of a linear motor.

FIG. 10 is a view showing the jacket of a linear motor of another embodiment in accordance with the present invention. The arrangement of the yoke and permanent magnets of the movable element of the outer portion of the jacket is the same as the arrangement shown in FIG. 5.

A feature of the present embodiment is that the jacket covers themselves serve as reinforcing members. Reference numerals 14 and 14' denote jacket covers formed by cutting material into an annular and coil shape, and forming the jacket for the coil 1. The jacket covers 14 and 14' are joined together even in the air core portion of the coil 1. They are joined together at the air core portion using an adhesive, a bolt, or the like, to prevent an increase in the distance between the thin portions of the jacket covers due to the pressure of the cooling medium. In other words, the opposing protrusions of the inner faces of the jacket covers 14 and 14' function as the reinforcing members for preventing deformation of the jackets. The coil 1 is fixed around the reinforcing members by means of a fixing means 7.

By virtue of such a structure, the jacket can be formed with an even fewer number of component parts, thus increasing reliability. The joined portion of the jacket covers in the coil air core portion is thicker than the thin sheets, so that space for the bolt portion or the screw portion, for example, required for joining the jacket covers together can be easily accessed, thus making it easier to design techniques for joining the jacket covers together.

<Embodiment 6>

Figure 11:
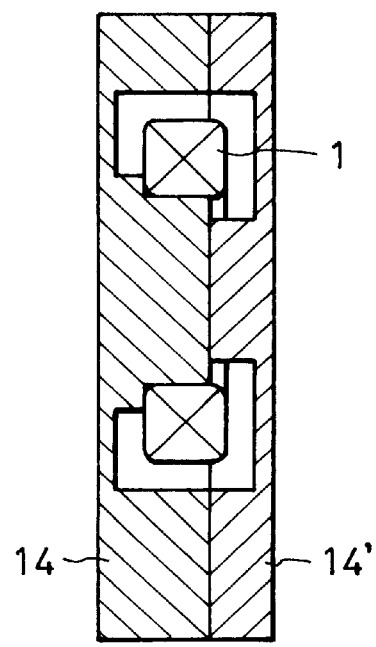
FIG. 11 is a view showing the jacket of still another embodiment of a linear motor.

FIG. 11 is a view showing the jacket of a linear motor of another embodiment in accordance with the present invention. The arrangement of the yoke and permanent magnets of the movable element of the outer portion of the jacket is the same as the arrangement shown in FIG. 5.

In the present embodiment, even the fixing means 7 is integrally formed with the jacket covers 14, 14', forming a single member. The coil 1 is fixed to the jacket covers 14, 14', by fitting the coil 1 into a cavity formed in the jacket cover 14. The jacket covers 14 and 14' are joined together using an adhesive, a bolt, or the like, and are so joined together even at the air core portion of the coil 1. The portions of the covers 14 and 14' joined at the air core portion form the reinforcing members.

By virtue of such a structure, the number of component parts to be used can be minimized, thereby increasing reliability. In addition, coil positioning can be done by processing the jacket covers, thereby considerably facilitating the assembly.

<Embodiment 7>

Figure 12:
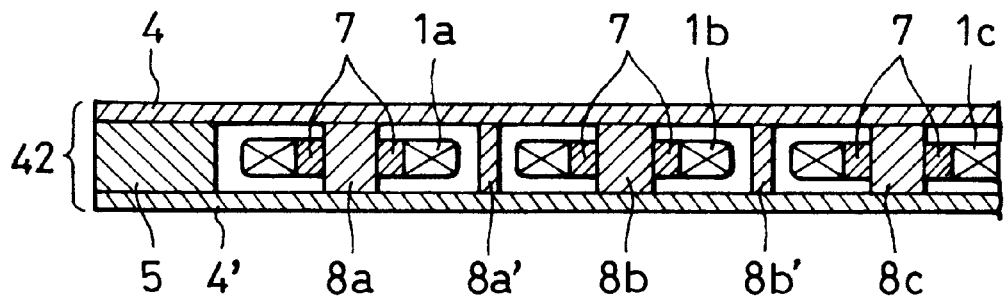
FIG. 12 is a view showing the jacket of still another embodiment of a linear motor.

FIG. 12 is a view showing the internal structure of the jacket of a linear motor of another embodiment in accordance with the present invention. The linear motor is a multi-phase linear motor whose overall structure is the same as that shown in FIG. 2. The multi-phase linear motor is incorporated in the stage device of FIG. 1 and the exposure apparatus of FIG. 22.

In FIG. 12, reference numerals 1*a* to 1*c* are coils for permitting current flow for driving the motor, reference numerals 4 and 4' denote sheets sandwiching each of the coils, and reference numeral 5 denotes a frame supporting the two sheets 4 and 4'. The sheets 4 and 4' and the frame 5 form the jacket 42 surrounding the coils 1*a* to 1*c*. The sheets 4 and 4' and the sheet 5 are joined together using an adhesive, a bolt, or the like. Reference numeral 7 denotes fixing means for fixing the coils 1*a* to 1*c*. Reference numerals 8*a* to 8*c* and reference numerals 8*a'* and 8*b'* denote reinforcing members which are characteristic members of the present embodiment and serve as pressure-resistant means for preventing an increase in the distance between the sheets 4 and 4' affixed together using an adhesive, a bolt, or the like. The reinforcing members 8*a* to 8*c* are disposed in the air core portion of the wound coil 1, whereas the reinforcing members 8*a'* and 8*b'* are disposed between adjacent coils. It is preferable that the sheets 4 and 4', the frame 5, and the reinforcing members 8 are made of non-magnetic and insulating materials, such as high-polymer resinous materials (e.g., PEEK) or ceramic materials. The two lead wires of each of the coils 1*a* to 1*c* which are led from the inside to the outside of the jacket are not shown. The cooling medium, supplied from a supply tube (not shown), flows through the jacket to absorb the heat produced in the coils, and is discharged from a recovery tube (not shown) for recovering it. The conductor coil 1, which is subjected to surface treatment, does not directly contact the cooling medium. The cooling medium is either a liquid or a gas, and is, preferably, inert.

Although in FIG. 12 the coils 1 are affixed to their respective reinforcing members 8*a* to 8*c* with the fixing means 7, they may be affixed to the sheets 4 and 4' or the reinforcing members 8*a'* and 8*b'*. In addition, although the reinforcing members 8*a* to 8*c* are not directly affixed to the coils 1*a* to 1*c*, the coils 1*a* to 1*c* may be affixed to the reinforcing members 8*a* to 8*c* without the use of fixing means 7. Further, the fixing means 7, the reinforcing members 8*a* to 8*c* and 8*a'* and 8*b'* may be divided into a plurality of sections for use.

According to the present embodiment, deformation or breaking of the jacket can be prevented, even when the pressure of the cooling medium is raised or the jacket sheets are made thin, thus making it possible to increase the cooling efficiency by increasing the flow rate of the cooling medium. In addition, it is possible to reduce the size of the jacket, and increase the thrust of the linear motor.

<Embodiment 8>

Figure 13:
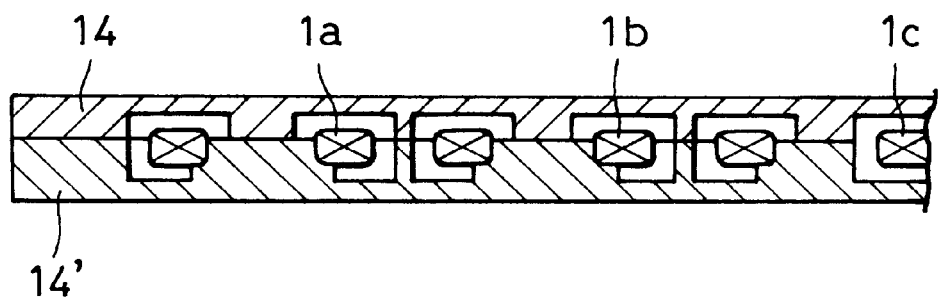
FIG. 13 is a view showing the jacket of still another embodiment of a linear motor.

FIG. 13 is a view showing the structure of the jacket of a linear motor in still another embodiment of the present invention. The arrangement of the yoke and permanent magnets of the outer side of the jacket is the same as the arrangement shown in FIG. 2.

In the present embodiment, the frame, the sheets, the fixing means, and the reinforcing members, which were separate component parts in the previous embodiment, are partly or entirely integrally formed. The two jacket covers 14 and 14' cover the coils so as to secure them, and are joined together. The jacket covers 14 and 14' are formed by cutting material into a coil shape, and the coils 1*a* to 1*c* are affixed to the jacket cover 14' at their corresponding air core portions. The jacket covers 14 and 14' are joined together at the air-core portions and between adjacent coils, using an adhesive, a bolt, or the like, in order to prevent an increase in the distance between the thin portions of the jacket covers due to the pressure of the cooling medium. In other words, opposing protrusions at the inside faces of the jacket covers 14 and 14' serve as reinforcing members that reinforce the jackets to prevent deformation thereof.

In addition to the advantage of facilitating assembly due to the fewer number of parts required to produce the jacket, this structure provides the advantage of reducing the possibility of leakage of cooling medium from a joined portion, since only the jacket covers 14 and 14' need to be joined together. The joined portion of the jacket covers in the coil air core portion is thicker than the thin sheets, so that the space required for the bolt portion or the screw portion, for example, for joining the jacket covers together can be easily accessed, thus making it easier to design techniques for joining the jacket covers together.

<Embodiment 9>

Figure 14:
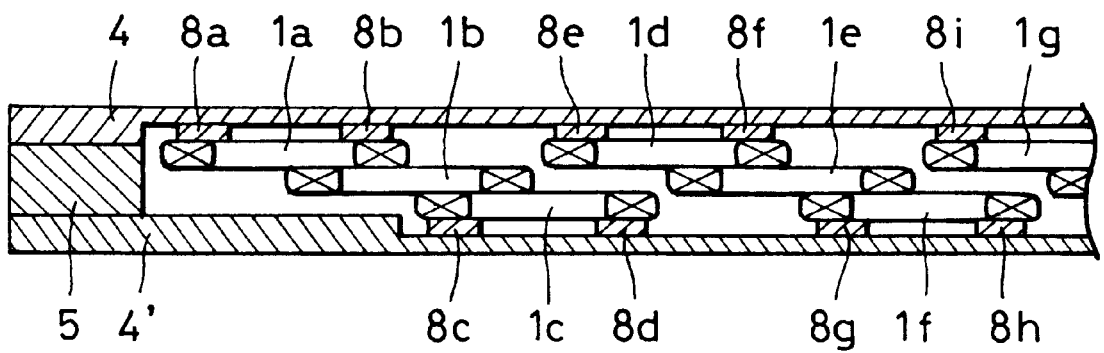
FIG. 14 is a view showing the jacket of still another embodiment of a linear motor.

FIG. 14 is a view showing the structure of the jacket of a linear motor in still another embodiment of the present invention. The arrangement of the yoke and the permanent magnets of the movable element of the outer side of the jacket is the same as the arrangement shown in FIG. 2.

In the present embodiment, the sheets 4 and 4' and the frame 5 form the cooling jacket, with coils 1*a* to 1*c* being placed upon each other and affixed to the sheets 4 and 4' by reinforcing members 8a to 8d, using an adhesive or the like, and coils 1d to 1f being placed upon each other and affixed to the sheets 4 and 4' by reinforcing members 8e to 8h, using an adhesive or the like. The portion of the sheets 4 opposing the coils 1 and the portion of the sheets 4' opposing the coils 1 are joined together using the coils 1 and the reinforcing members 8, so that the coils 1 and the reinforcing members 8 function as pressure-resistant means. The sheets 4 and 4' and the reinforcing members 8 may be integrally formed. In addition, the sheets 4 and 4' and the frame 5 may be integrally formed to form one member. An increase of the distance between the sheets due to the pressure of the cooling medium is prevented without placing reinforcing members in the air-core portions of the coils and between the coils.

By virtue of such a structure, the reinforcing members can be disposed independent of the shape and position of the coil, since the reinforcing member does not extend through the air core portion of the coil or the like. It is preferable that the coils be placed upon each other such that only part of one coil is directly underneath another coil.

<Embodiment 10>

Figure 15:
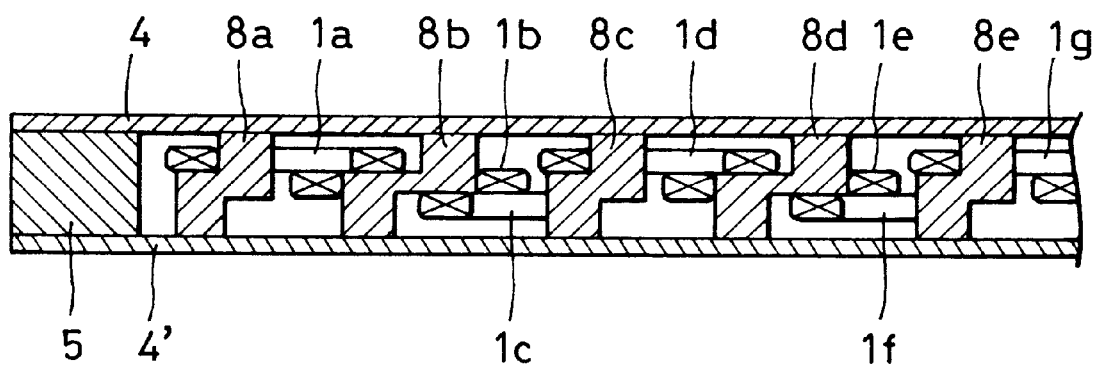
FIG. 15 is a view showing the jacket of still another embodiment of a linear motor.

FIG. 15 is a view showing the structure of the jacket of a linear motor of still another embodiment of the present invention. The arrangement of the yoke and the permanent coils of the outer side of the jacket is the same as the arrangement shown in FIG. 2.

In the previous embodiment, the reinforcing members were not placed in, for example, the air-core portions of the coils, but in the present embodiment, the reinforcing members are placed in the air-core portions of the coils (e.g., placed upon by each other such that only part of one coil is directly underneath another coil) so as to avoid the coil bodies. The sheets 4 and 4' are directly joined to the reinforcing members 8a to 8e. The sheets 4 and 4' and the frame 5 may be integrally formed to form one member. Although, in the figure, the reinforcing members and the coils are directly joined together using an adhesive or by integrally forming the reinforcing members and the coils, these components may be joined together using fixing means or the like. The reinforcing members help prevent an increase in the distance between the sheets.

According to the present embodiment, deformation or breaking of the jacket can be prevented, even when the pressure of the cooling medium is raised or the jacket sheets are made thin, thus making it possible to increase the cooling efficiency by increasing the flow rate of the cooling medium. In addition, it is possible to reduce the size of the jacket, and increase the thrust of the linear motor.

<Embodiment 11>

Figure 16:
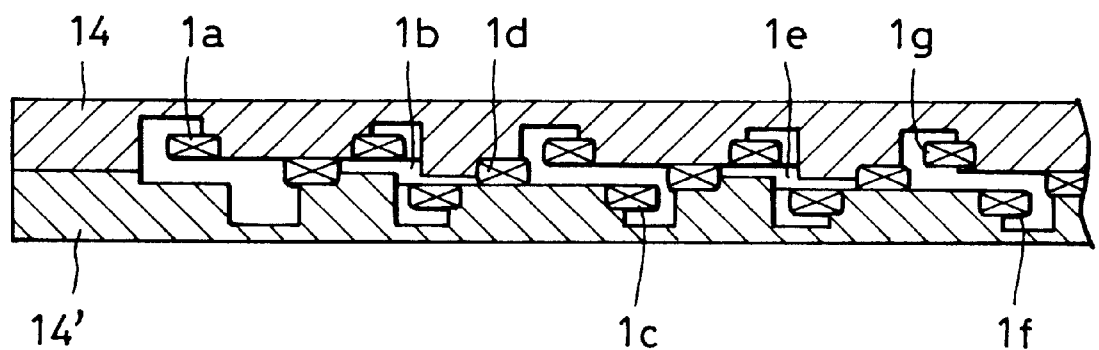
FIG. 16 is a view showing the jacket of still another embodiment of a linear motor.

FIG. 16 is a view showing the structure of the jacket of a linear motor in still another embodiment of the present invention. The arrangement of the yoke and permanent magnets of the movable element of the outer portion of the jacket is the same as the arrangement shown in FIG. 2.

In the previous embodiment, the frames, sheets, fixing means, and reinforcing members were partly or entirely formed into an integral structure. In the present embodiment, the two jacket covers 14 and 14' are used to cover the coils so as to secure them, and are joined together. The jacket covers are formed by cutting into a coil shape, with coils 1a, 1d, and 1g being secured to the jacket cover 14 at their respective air-coil sections, and coils 1c and 1f being secured to the jacket cover 14' at their respective air-core sections. The coils 1b and 1e are secured to both of the jacket covers 14 and 14' at their respective air-core sections. The jacket covers 14 and 14' are joined together by means of, for example, the coils 1b and 1e to prevent an increase in the distance between the thin portions of the jacket covers due to pressure of the cooling medium. In other words, the protrusions at the inner faces of the jacket covers 14 and 14' serve as reinforcing members for reinforcing the jacket to prevent deformation thereof.

In addition to the advantage of facilitating assembly due to the fewer number of parts required to produce the jacket, the structure provides the advantage of reducing the possibility of cooling medium leakage from a joined portion, since only the jacket covers 14 and 14' need to be joined together. In addition, it is easier to position the coils during assembly, since the jacket is formed by cutting into a coil shape.

<Embodiment 12>

Figure 17:
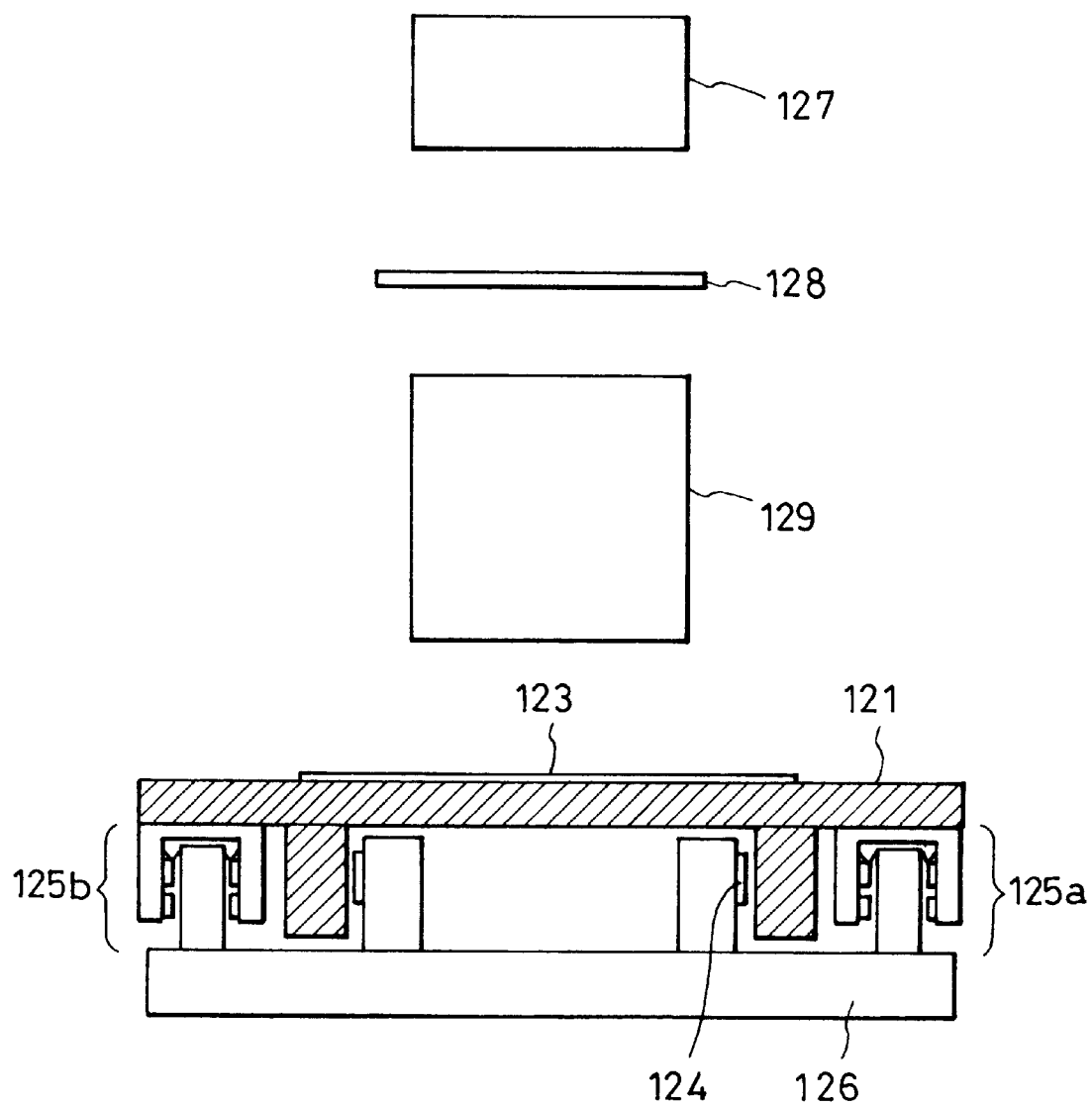
FIG. 17 is a structural view of an exposure apparatus with a stage.

FIG. 17 is a view showing an embodiment of an exposure apparatus provided with a wafer stage using any one of the above-described linear motors of the present invention. Referring to FIG. 17, reference numeral 121 denotes a wafer stage with a tilting mechanism. A semiconductor wafer 123 is placed on the top surface of the wafer stage. Above the wafer stage 121 are provided an illumination system 127 including a light source and an illuminating optical means, a reticle 128 with a pattern to be transferred onto the wafer, and a reduction projection optical system 129 for projecting, by reduction, the pattern on the reticle 128 at a predetermined magnification.

A description will now be given of the structure of the wafer stage. Reference numeral 124 is a guide for restricting the tilting stage in the horizontal direction. It may, for example, be a static pressure bearing which allows movement in the Z direction, the tilting direction, and the Z-axis rotational direction. Reference numeral 126 denotes a base. Reference numeral 125 denotes linear motors having any one of the structures of FIGS. 5 to 11 described above. Driving three of these linear motors (the third one is not shown) permits adjustment of the position of the stage 121 in the Z direction, being the direction of the center of gravity thereof, or the tilting of the stage 121 with respect to the base 126. In addition, when the position of the stage in the Z direction and the tilting of the stage 121 are determined, it is possible to control the position of the stage in the Z direction and tilting of the stage.

According to the present embodiment, the cooling efficiency of the linear motor is increased, and the heat produced from the coils is recovered, thus preventing the heat from being transmitted to the wafer stage from the motor and increasing the ambient temperature. Therefore, the wafer stage can be positioned with much greater accuracy, which results in transfer by exposure with an accuracy higher than had been conventionally possible.

<Embodiment 13>

Figure 18:
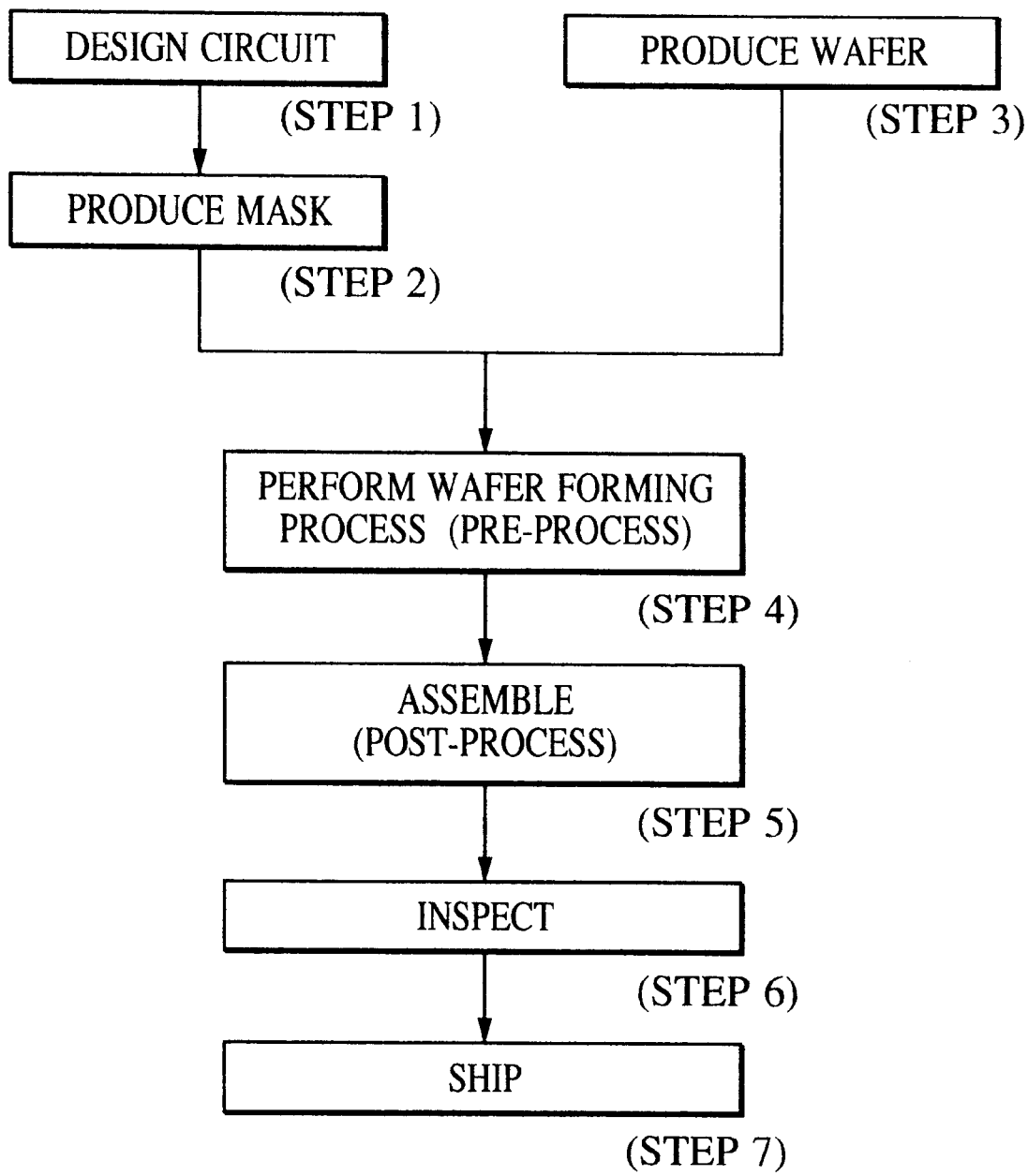
FIG. 18 is a flowchart illustrating the steps for producing a semiconductor device.

FIG. 18 is a flowchart showing the steps for producing a semiconductor device (such as a semiconductor chip including an IC or LSI, a liquid crystal panel, or a CCD) used in the aforementioned exposure apparatus. In Step 1, the circuit of the semiconductor device is designed. In Step 2, a mask with a designed circuit pattern is formed. In Step 3, a wafer is produced using silicon or other such material. In Step 4 (or the wafer forming process), called the pre-processing step, the prepared mask and wafer are used to actually form the circuit onto the wafer using lithography techniques. In Step 5, called the post-processing step, the wafer subjected to circuit formation in Step 4 is used to form a semiconductor chip. This step includes an assembly step (dicing, bonding), a packaging step (of a chip), and the like. In Step 6, the semiconductor device prepared in Step 5 is inspected by conducting tests such as semiconductor device operation confirmation tests and durability tests. Thereafter, in Step 7, the semiconductor device is shipped.

Figure 19:
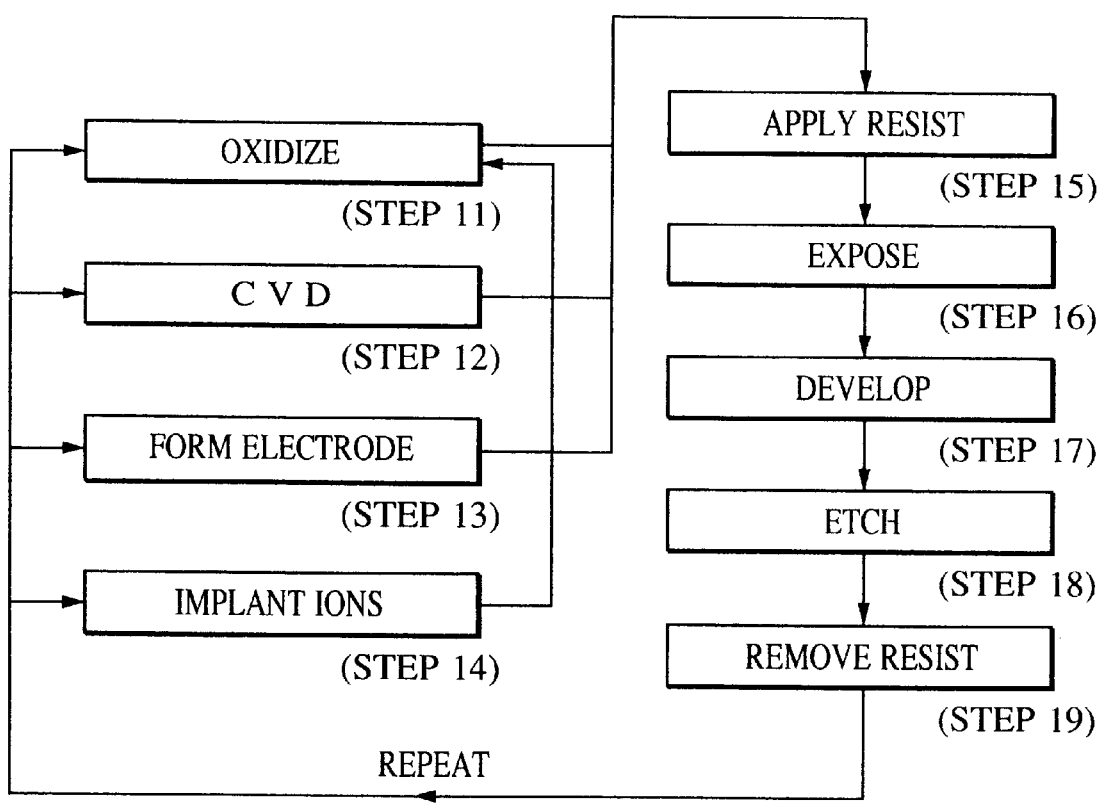
FIG. 19 is a flowchart illustrating the steps of the wafer forming process in the semiconductor device production method shown in FIG. 18.
Figure 20:
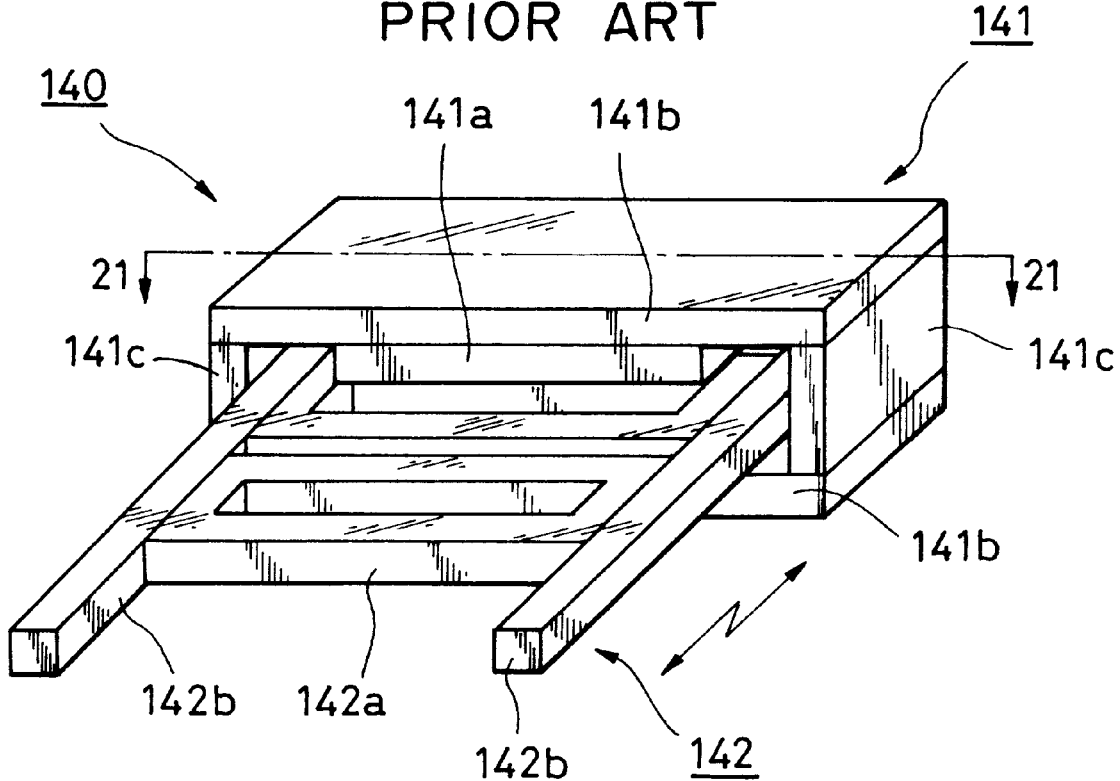
FIG. 20 is a partial perspective view of the main portion of a conventional linear motor.
Figure 21:
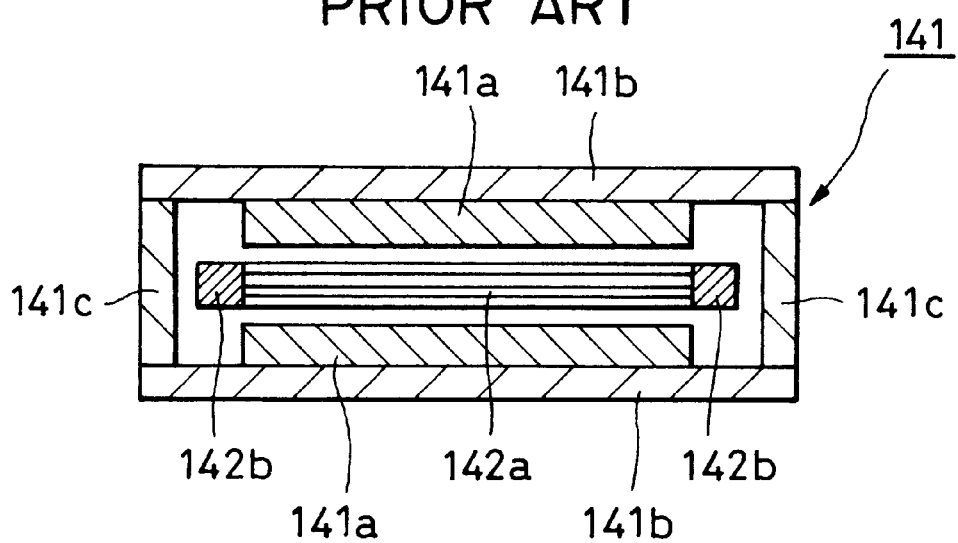
FIG. 21 is a cross-sectional view taken along line 21—21 of FIG. 20.

FIG. 19 is a detailed flowchart showing the above-described wafer forming process. In Step 11, the wafer surface is oxidized. Then, in Step 12 (chemical-vapor deposition (CVD) step), an insulation film is formed on the wafer surface. In Step 13, an electrode is formed on the wafer by evaporation, for example. In Step 14, ions are implanted into the wafer. In Step 15, a photosensitization agent is applied onto the wafer. In Step 16, the mask circuit pattern is printed onto the wafer by the aforementioned exposure. In Step 17, the exposed wafer is developed. In Step 18, the portions other than the developed resist image are etched. In Step 19, the unwanted resist is removed after etching. Multiple circuit patterns are formed on the wafer by repeating the aforementioned steps.

Except as otherwise disclosed herein, the various components shown in outline or in block form in the Figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A linear motor for a precise stage device, comprising:
   at least one coil;
   at least one permanent magnet; and a jacket, made of an insulating material, which covers said at least one coil and allows a cooling medium to be supplied through a space between the jacket and the coil in said jacket.

2. A linear motor according to claim 1, further comprising a yoke, wherein there are at least two permanent magnets and wherein the jacket is interposed between the magnets.

3. A linear motor according to claim 1, wherein the insulating material is a ceramic material.

4. A linear motor according to claim 1, wherein the insulating material is a high-polymer resinous material.

5. A linear motor for a precise stage device, comprising:
   at least one coil;
   at least one permanent magnet;
   a jacket which covers said at least one coil and allows a cooling medium to be supplied through a space in said jacket; and
   a reinforcing member disposed in said jacket for reinforcing said jacket against the pressure of the cooling medium, wherein said reinforcing member is disposed at an air-core portion of said at least one coil.

6. A linear motor according to claim 5, further comprising a yoke, wherein there are at least two permanent magnets and wherein the jacket is interposed between the magnets.

7. A linear motor according to claim 5, wherein said jacket comprises a frame and two sheets, which are joined together such that said frame is interposed between said two sheets.

8. A linear motor according to claim 5, wherein said jacket comprises two jacket covers which are joined together.

9. A linear motor according to claim 5, wherein said jacket and said reinforcing member are made of a non-magnetic material.

10. A linear motor according to claim 9, wherein the material is one of a ceramic material and a high-polymer resinous material.

11. A linear motor according to claim 5, wherein the reinforcing member holds said coil.

12. A linear motor according to claim 5, wherein said reinforcing member is a protrusion formed as part of said jacket.

13. A linear motor according to claim 5, wherein a structural part of said jacket secures said at least one coil.

14. A precise stage device comprising:
   a linear motor which constitutes a driving mechanism, wherein said linear motor comprises;
   at least one coil; and
   a jacket, made of an insulating material, which covers said at least one coil and allows a cooling medium to be supplied through a space between the jacket and the coil in said jacket.

15. A precise stage device, comprising:
   a linear motor which constitutes a driving mechanism, wherein said linear motor comprises:
   a coil;
   at least one permanent magnet;
   a jacket which covers said coil and allows a cooling medium to be supplied through a space in said jacket; and
   a reinforcing member disposed in said jacket for reinforcing said jacket against the pressure of the cooling medium, wherein said reinforcing member is disposed at an air-core portion of said at least one coil.

16. An exposure apparatus, comprising:
   a precise stage device which comprises a linear motor, said linear motor comprising (i) at least one coil, (ii) at least one permanent magnet and (iii) a jacket, made of an insulating material, which covers said at least one coil and allows a cooling medium to be supplied through a space between the jacket and the coil in said jacket; and
   exposure means for exposing a substrate held by said precise stage device.

17. An exposure apparatus according to claim 16, further comprising a laser interferometer for measuring the position of said stage device.

18. An exposure apparatus, comprising:
   a precise stage device which comprises a linear motor, said linear motor comprising (i) at least one coil, (ii) at least one permanent magnet, (iii) a jacket which covers said one coil and allows a cooling medium to be supplied through a space in said jacket, and (iv) a reinforcing member disposed in said jacket for reinforcing said jacket against the pressure of the cooling medium; and
   exposure means for exposing a substrate held by said stage device.

19. An exposure apparatus according to claim 18, further comprising a laser interferometer for measuring the position of said stage device.

20. A device producing method for producing a device, said method comprising:

holding a substrate by a precise stage device which comprises a linear motor, the linear motor comprising (i) at least one coil, (ii) at least one permanent magnet and (iii) a jacket, made of an insulating material, which covers said at least one coil and allows a cooling medium to be supplied through a space between the jacket and the coil in the jacket; and exposing the substrate held by the precise stage device, to produce a device.

21. A device producing method for producing a device, said method comprising:

holding a substrate by a precise stage device which comprises a linear motor, said linear motor comprising (i) at least one coil, (ii) at least one permanent magnet, (iii) a jacket which covers the at least one coil and allows a cooling medium to be supplied through a space in the jacket, and (iv) a reinforcing member disposed in the jacket for reinforcing the jacket against the pressure of the cooling medium; and exposing a substrate by said stage device, to produce a device.

22. A linear motor for a precise stage device, comprising:

at least one coil;

at least one permanent magnet;

a jacket made of an insulating material, which covers said at least one coil and allows a cooling medium to be supplied through a space between the jacket and the coil in said jacket; and a reinforcing member disposed in said jacket for reinforcing said jacket against the pressure of the cooling medium.

23. A linear motor according to claim 22, wherein said reinforcing member is disposed at an air-core portion of said at least one coil.

24. A linear motor according to claim 23, wherein the reinforcing member holds said at least one coil.

25. A stage device according to claim 14, further comprising a reinforcing member disposed in said jacket for reinforcing said jacket against the pressure of the cooling medium.

26. A stage device according to claim 25, wherein said reinforcing member is disposed at an air-core portion of said coil.

27. A stage device according to claim 26, wherein the reinforcing member holds said coil.

28. An exposure apparatus according to claim 16, further comprising a reinforcing member disposed in said jacket for reinforcing said jacket against the pressure of the cooling medium.

29. An exposure apparatus according to claim 28, wherein said reinforcing member is disposed at an air-core portion of said coil.

30. An exposure apparatus according to claim 29, wherein the reinforcing member holds said coil.

31. A stage device according to claim 15, wherein the reinforcing member holds said coil.

32. An exposure apparatus according to claim 18, wherein the reinforcing member holds said coil.

33. A linear motor for a stage device, comprising:

at least one coil;

at least one permanent magnet; and a jacket, made of an insulating material, which covers said at least one coil and allows a cooling medium to be supplied through a space in said jacket.

34. A linear motor for a stage device, comprising:

at least one coil;

at least one permanent magnet;

a jacket which covers said at least one coil and allows a cooling medium to be supplied through a space in said jacket; and a reinforcing member disposed in said jacket for reinforcing said jacket against the pressure of the cooling medium, wherein said reinforcing member is disposed at an air-core portion of said at least one coil.

35. A stage device, comprising:

a linear motor which constitutes a driving mechanism, wherein aid linear motor comprises;

at least one coil; and jacket, made of an insulating material, which covers said at least one coil and allows a cooling medium to be supplied through a space in said jacket.

36. A stage device, comprising:

a linear motor which constitutes a driving mechanism, wherein said linear motor comprises:

at least one coil;

at least one permanent magnet;

a jacket, which covers said at least one coil and allows a cooling medium to be supplied through a space in said jacket; and a reinforcing member disposed in said jacket for reinforcing said jacket against the pressure of the cooling medium, wherein said reinforcing member is disposed at an air-core portion of said at least one coil.

37. A stage device, comprising:

a linear motor which constitutes a driving mechanism, wherein said linear motor comprises:

a coil;

at least one permanent magnet;

a jacket, which covers said at least one coil and allows a cooling medium to be supplied through a space in said jacket; and a reinforcing member disposed in said jacket for reinforcing said jacket against the pressure of the cooling medium, wherein said reinforcing member is disposed at an air-core portion of said at least one coil.

38. An exposure apparatus, comprising:

a stage device which comprises a linear motor, said linear motor comprising (i) at least one coil, (ii) at least one permanent magnet and (iii) a jacket, made of an insulating material, which covers said at least one coil and allows a cooling medium to be supplied through a space in said jacket; and exposure means for exposing a substrate held by said stage device.

39. An exposure apparatus, comprising:

a stage device which comprises a linear motor, said linear motor comprising (i) at least one coil, (ii) at least one permanent magnet, (iii) a jacket which covers said at least one coil and allows a cooling medium to be supplied through a space in said jacket and (iv) a reinforcing member disposed in said jacket for reinforcing said jacket against the pressure of the cooing medium; and exposure means for exposing a substrate held by said stage device.

40. A device producing method for producing a device, said method comprising:

holding a substrate by a stage device which comprises a linear motor, the linear motor comprising (i) at least one coil, (ii) at least one permanent magnet and (iii) a jacket, made of an insulating material, which covers said at least one coil and allows a cooling medium to be supplied through a space in said jacket; and exposing the substrate held by the stage device, to produce a device.

41. A device producing method for producing a device, said method, comprising:

holding a substrate by a stage device which comprises a linear motor, the linear motor comprising (i) at least one coil, (ii) at least one permanent magnet, (iii) a jacket which covers said at least one coil and allows a cooling medium to be supplied through a space in said jacket anti (iv) a reinforcing member disposed in said jacket for reinforcing said jacket against the pressure of the cooling medium; and exposing a substrate by said stage device, to produce a device.

* * * * *

UNITED STATES PATENT AND TRADEMARK OFFICE
CERTIFICATE OF CORRECTION

PATENT NO. : 6,084,319
DATED : July 4, 2000
INVENTOR(S) : SHIGETO KAMATA ET AL.

It is certified that error appears in the above-identified patent and that said Letters Patent is hereby corrected as shown below:

COLUMN 1

Line 60, "i.e," should read --i.e.,--.

COLUMN 13

Line 62, "cooling," should read --cooling--.

COLUMN 18

Line 6, "anti" should read --and--.

Signed and Sealed this

Seventeenth Day of April, 2001

Attest:

NICHOLAS P. GODICI

Attesting Officer　　　Acting Director of the United States Patent and Trademark Office